United States Patent [19]
Lee

[11] Patent Number: 5,315,236
[45] Date of Patent: May 24, 1994

[54] POWER CONSUMPTION METER FOR DISPLAYING ELECTRIC POWER CONSUMED BY APPLIANCE AND THE TIME PERIOD OF CONSUMPTION

[76] Inventor: Graham S. Lee, 760 Fairmile Rd., West Vancouver, British Columbia, Canada, V7S 1R2

[21] Appl. No.: 664,888

[22] Filed: Mar. 5, 1991

[51] Int. Cl.⁵ .................. G01R 22/00; G01R 21/06; G06F 15/56; G07C 1/00
[52] U.S. Cl. .................. 324/157; 324/103 R; 324/116; 324/142; 324/149; 364/483; 377/20
[58] Field of Search .................. 324/103 R, 113, 114, 324/115, 116, 142, 149, 156, 157; 364/483, 464.04; 377/16, 20

[56] References Cited

U.S. PATENT DOCUMENTS

| | | | |
|---|---|---|---|
| 1,704,520 | 3/1929 | Sommer | 324/103 R |
| 4,120,031 | 10/1978 | Kincheloe et al. | 324/113 X |
| 4,180,724 | 12/1979 | Councilman et al. | 377/16 |
| 4,401,943 | 8/1983 | Morris | 324/157 |
| 4,814,996 | 3/1989 | Wang | 364/483 X |
| 4,977,515 | 12/1990 | Rudden et al. | 364/483 X |
| 5,014,213 | 5/1991 | Edwards et al. | 364/483 |

FOREIGN PATENT DOCUMENTS 2738853  3/1979  Fed. Rep. of Germany .
303395A1 4/1982  Fed. Rep. of Germany .

Primary Examiner—Gerard R. Strecker
Attorney, Agent, or Firm—John Russell Uren

[57] ABSTRACT

A power meter (10) is provided which can plug into an electric wall socket and it is provided with its own socket (16) for receiving the plug of an electrical appliance. The power meter has means for measuring electric current flow to an electrical appliance and indicates the amount of electrical power consumed by an appliance. In alternative embodiments, the meter is provided as an integral part of an electric wall switch (30) or wall socket (40) or it is built into an electrical appliance (50). In another embodiment, the power meter has a plurality of sockets for receiving the plugs of a number of electrical appliances for separately indicating the power consumption of each appliance.

6 Claims, 5 Drawing Sheets

POWER CONSUMPTION METER FOR DISPLAYING ELECTRIC POWER CONSUMED BY APPLIANCE AND THE TIME PERIOD OF CONSUMPTION

FIELD OF THE INVENTION

This invention relates to a meter for measuring power consumption of an electrical appliance.

BACKGROUND OF THE INVENTION

Electrical appliances differ widely with respect to the amounts of electricity which they consume, which, in turn, determines the cost of running the appliances. However, in most cases, the amount of electricity consumed by an appliance is not readily apparent to a consumer. It would be useful if a consumer had means at his disposal by which electric power consumption could be measured, in which case a consumer could take steps to use higher power consumption devices more sparingly in order to save costs. This would result in a general saving of energy, which is in the public interest.

It is accordingly an object of the present invention to provide a power meter which readily provides a consumer with data regarding the power consumption of an electrical appliance.

SUMMARY OF THE INVENTION

According to the invention, there is provided an electric power meter, comprising a body member; prongs on the body member for insertion into an electric wall socket; a socket on the body member for receiving the plug of an electric appliance, said socket being in electrical communication with the prongs for transferring electric power from the prongs to said socket; current measuring means in the body member for measuring electric current flow between said prongs and said socket on the body member; and timing means for measuring the duration of said electric current flow.

Also according to the invention, there is provided an electric wall switch assembly, comprising a wall plate for mounting on a wall; an electric switch on the plate; means for connecting the switch in series with an electric conductor for controlling the flow of electric current through the conductor; current measuring means for measuring electric current flowing across the switch; and timing means for measuring the duration of said electric current flow.

Further according to the invention, there is provided an electric wall plug assembly, comprising a wall plate for mounting on a wall; a socket on the plate for connection to an electric power supply, said socket being adapted to receive the plug of an electric appliance; current measuring means for measuring electric current flow through the socket; and timing means for measuring the duration of electric current flow through the socket.

Also according to the invention, there is provided in an electrical appliance having a body member and an electric power line for connection to an electric power source for supplying an electric current to the appliance, an electric power meter connected in series with the electric power line for the flow of said electric current therethrough, comprising current measuring means for measuring said electric current; and timing means for measuring the duration of said electric current flow.

Further according to the invention, there is provided an electric power meter, comprising current measuring means for measuring electric current flow to an electrical appliance; timing means for measuring the duration of said electric current flow; processing means for receiving data from said current measuring means to calculate electric power consumed by said appliance; and display means for displaying the electric power consumed and the time period over which said electric power has been consumed.

Further objects and advantages of the invention will become apparent from the description of preferred embodiments of the invention below.

DETAILED DESCRIPTION OF PREFERRED EMBODIMENTS

Figure 1A:
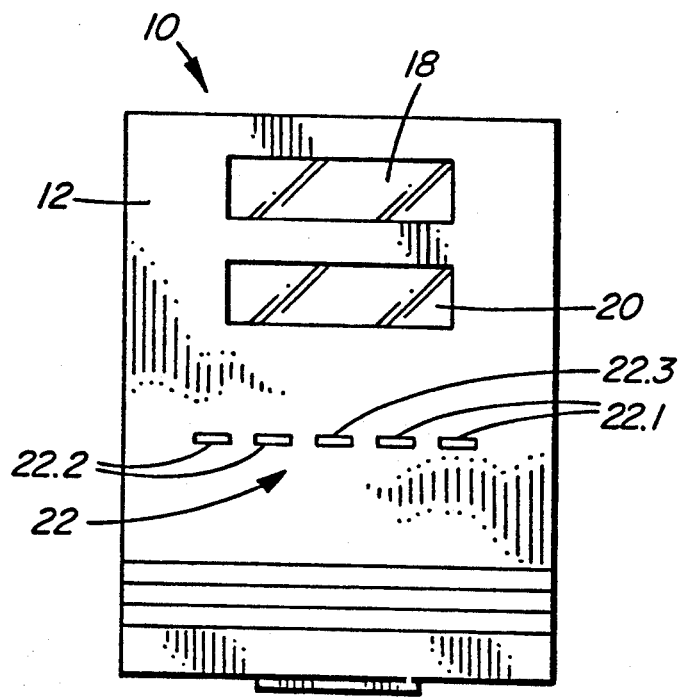
FIGS. 1A to D are front, side, top and rear views of a power meter according to one embodiment of the invention.
Figure 1B:
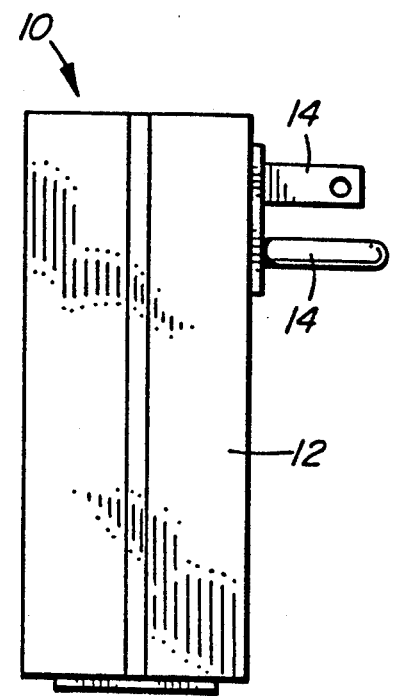
Figure 1C:
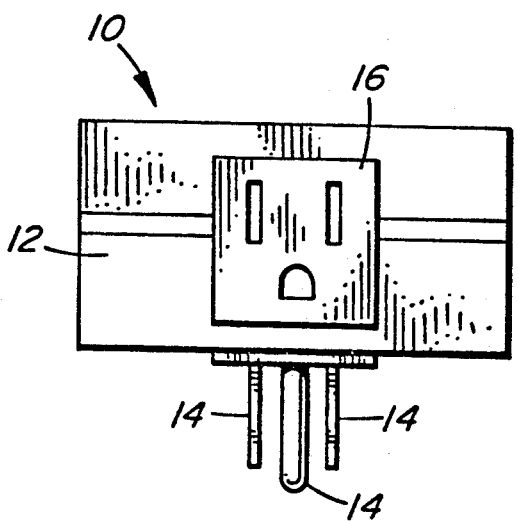
Figure 1D:
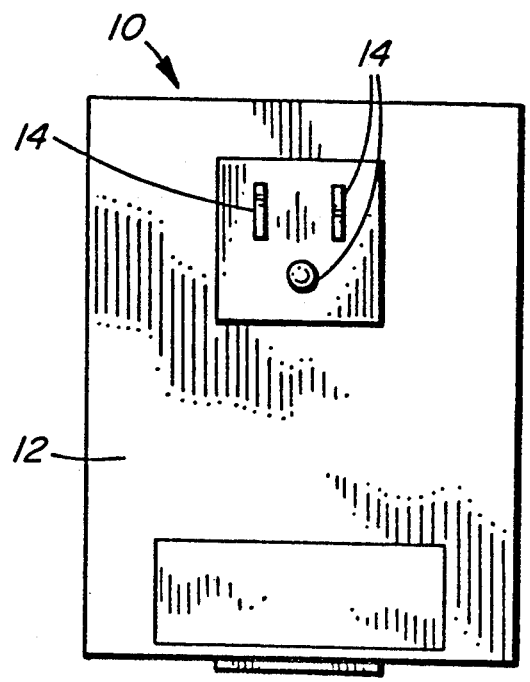

With reference to FIGS. 1A to 1D, reference numeral 10 generally indicates a power meter comprising a body member 12 provided with prongs 14 on its rear side for insertion into an electric wall socket (not shown). An electric socket 16 is provided on the top of the body member for receiving the electric plug of an electrical appliance (not shown).

The power meter 10 is further provided with two displays on the front of the body member 12. The first display 18 indicates cumulative electric power consumption and the second display 20 indicates the time period over which the electric power has been consumed.

The power meter 10 further includes a power bar 22 which comprises a row of five LED's. The two LED's on the right hand side, indicated by reference numeral 22.1 are red, the two LED's 22.2 on the left hand side are green, and the LED 22.3 in the centre, is white. The purpose of the power bar 22 is to indicate when a high or a low power consumption device is connected, by either lighting up the red or the green LED's. In an intermediate condition, the central white LED is lit up. The power bar 22 therefore gives a qualitative indication of power consumption. Thus, when very high power consumption appliances are connected, the rightmost red LED 22.2 will be lit up and in less severe conditions, the next LED 22.2 will be lit up. On the other extreme, when very light power consumption appliances are connected, the leftmost LED 22.1 will be lit up and then the next LED 22.1, as the case may be. Alternatively, the operation of the power bar 22 may be cumulative, e.g. if an electrical device is of intermediate power usage, both the green LED's 22.2 and the white LED 22.3 may light up.

The working of the power meter 10 will now be described with reference to FIG. 2.

To determine the amount of power consumed by an appliance, the power meter 10 makes use of the fact that an alternating current in a wire generates a proportional magnetic field, and vice versa. Since the line voltage is known for the application at a particular location, the power may be calculated from the amount of current supplied to the appliance.

Figure 2:
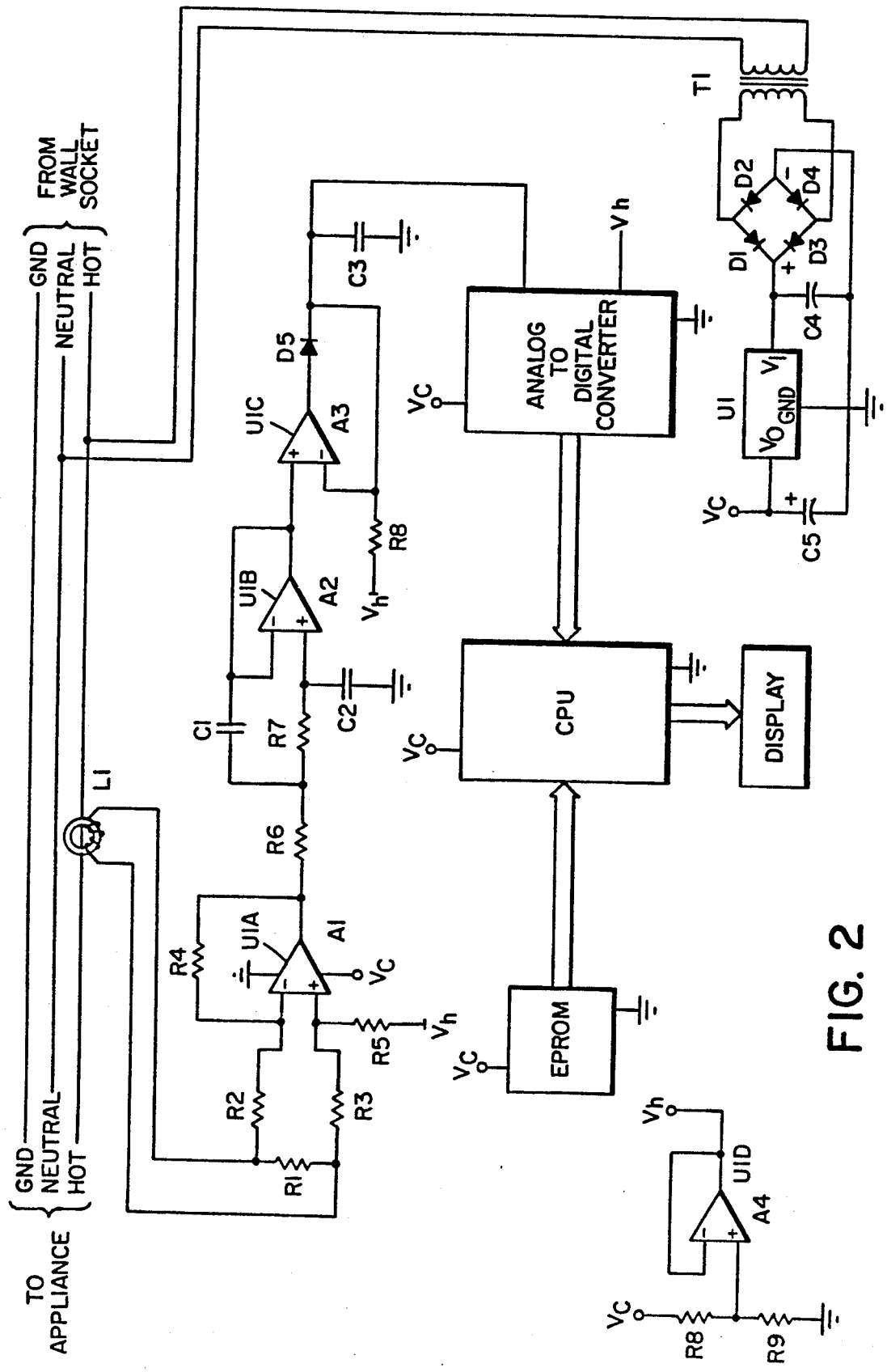
FIG. 2 is a schematical illustration of the electrical circuit of the power meter of FIG. 1.

Referring to the schematic in FIG. 2, L1 is a coil which is wound around a toroid. The conductor for the live connection of the appliance passes through the centre of the toroid. An alternating current passing through the live conductor will create a proportional magnetic field in the toroid, which will in turn induce a proportional alternating current through L1. This current provides an alternating signal across resistor R1. The voltage is then amplified with reference to Vh which is half the supply voltage Vc. Reference voltage Vh is formed by the resistors R8 and R9, and is buffered by the operational amplifier A4. The high gain differential amplifier is composed of operational amplifier A1 and resistors R2, R3, R4 and R5. After amplification, the signal is put through a low pass filter to eliminate any transients. The low pass filter is made up of operational amplifier A2, resistors R6, R7 and capacitors C1 and C2. The final step in processing the signal is performed by operational amplifier A3 which in conjunction with diode D5, resistor R8 and capacitor C3 rectify the alternating signal with reference to voltage Vh. The capacitor C3 is used to hold a DC level which is equal to the peak AC level. This DC voltage level is input to an analog to digital converter which provides a digital representation of the analog voltage to the processor.

The CPU along with its EPROM provide the computational ability for the system, calculating the power consumption based on the digital value provided by the analog to digital converter. This information is then sent to the display as watt-hours consumed. The processor also uses an internal clock to keep track of the amount of time that the appliance has been plugged in, and this is also sent to the display.

The DC power to run the electronics is derived from the AC lines. As seen in the schematic, the power transformer T1 is used to step down the line voltage. This is then rectified and filtered by diodes D1, D2, D3 and D4 and capacitor C4. Voltage regulator U1 provides a regulated output Vc, which is filtered by capacitor C5 and supplied to the electronics.

Figure 3:
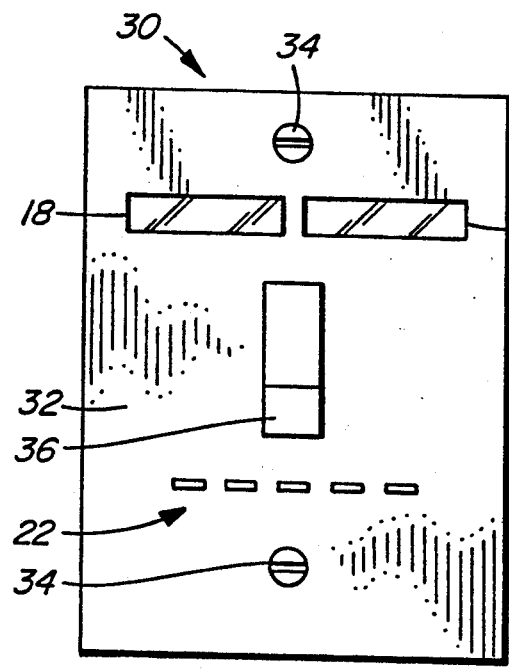
FIG. 3 is a front view of a power meter according to another embodiment of the invention.
Figure 4:
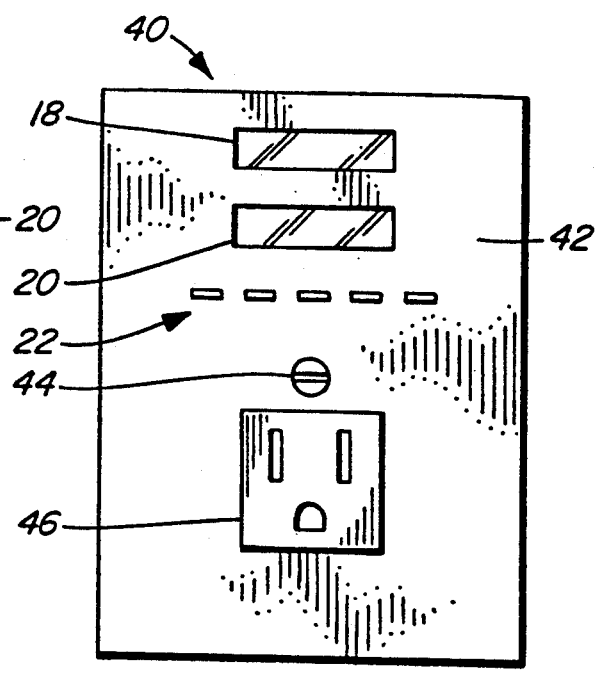
FIG. 4 is a front view of a power meter according to yet another embodiment of the invention.

With reference to FIGS. 3 and 4, two alternative embodiments, generally indicated by reference numerals 30 and 40 respectively, are shown. The power meters 30 and 40 operate in a fashion similar to that of power meter 10. However, the power meter 30 is in the form of a wall switch. It comprises a plate 32 for mounting on the wall by means of screws 34 and it includes a manually operated switch 36 for switching electric current supply on or off. As is the case with the power meter 10, the power meter 30 also has displays 18, for displaying cumulative electric power consumption and indicator 20 for indicating the time period during which the electric power has been consumed. It also has a power bar 22. The electric current flowing through the switch 36 is measured as described with reference to FIG. 2. The wall plate 32 may be provided with more than one switch 36.

With reference to FIG. 4, the power meter 40 is in the form of an electric wall socket. It comprises a plate 42 for mounting on a wall by means of a screw 44 and it has a electric socket 46 for receiving the plug of an electric appliance. It also includes a first display 18, for indicating power consumption, and a second display 20, for indicating time duration, as well as a power bar 22. The electric current flowing through the socket 46 when a plug is inserted is measured as described with reference to FIG. 2. The wall plate 42 may be provided with more than one socket 46.

Figure 5:
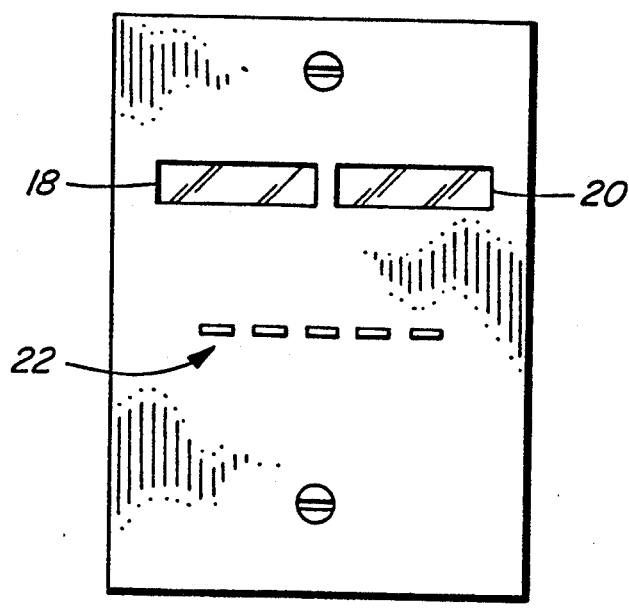
FIG. 5 is a front view of a power meter according to another embodiment of the invention.

Instead of being built into a wall switch or plug, as in FIGS. 3 and 4, respectively, the power meter can be provided as a unit on its own, a shown in the embodiment of FIG. 5.

In this case, the power meter can be installed next to a wall switch or wall socket, e.g. if componentry is too large to fit into an existing wall switch or socket.

Figure 6:
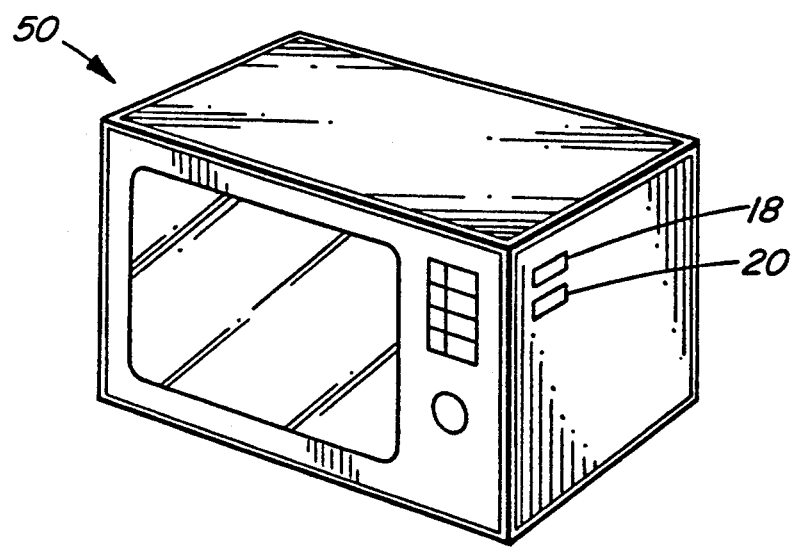
FIG. 6 is an isometric view of an electrical appliance incorporating a power meter according to the invention.

With reference to FIG. 6, a further embodiment of the invention is shown. In this embodiment, the power meter is built into an appliance, such as a microwave oven 50 in the present example. The first and second displays 18 and 20 ere provided on the body of the microwave oven 50 and display the electrical power consumption and time duration. The appliance may be any other electrically powered device such as a clock radio, electric lawn mower or dishwasher.

Figure 7:
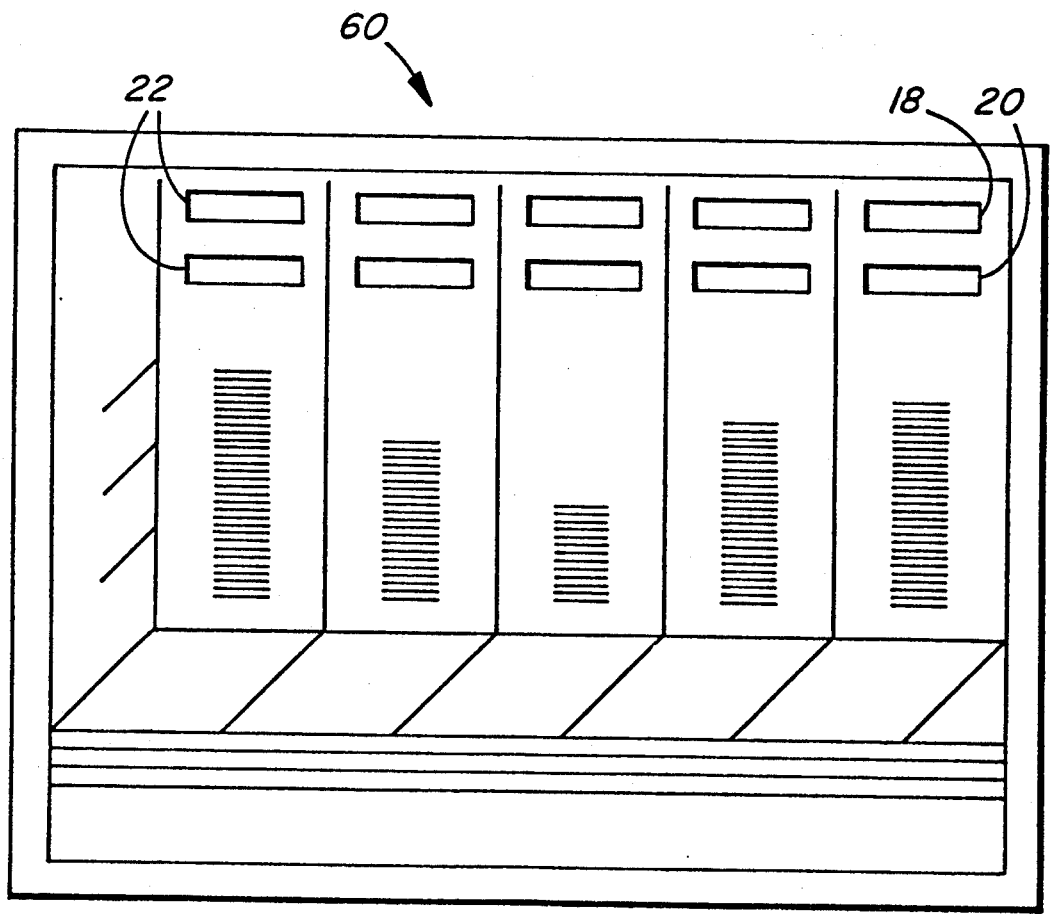
FIG. 7 is a front view of a power meter according to yet a further embodiment of the invention.

With reference to FIG. 7, a further embodiment is shown which comprises a panel 60 having separate displays 18 and 20 for different electrical appliances, such as an electric furnace, hot water heater, etc. Thus, the electric consumption of a variety of different appliances can be measured. The panel 60 may, for example, be connected up to a household fuse box to indicate the power consumption of different electrical appliances associated with the different fuses in the fuse box. It is also contemplated that the panel 60 could be operated by sending signals along the existing electrical wiring from wall plugs, etc. being monitored, to the panel 60 for computation and display.

Figure 8A:
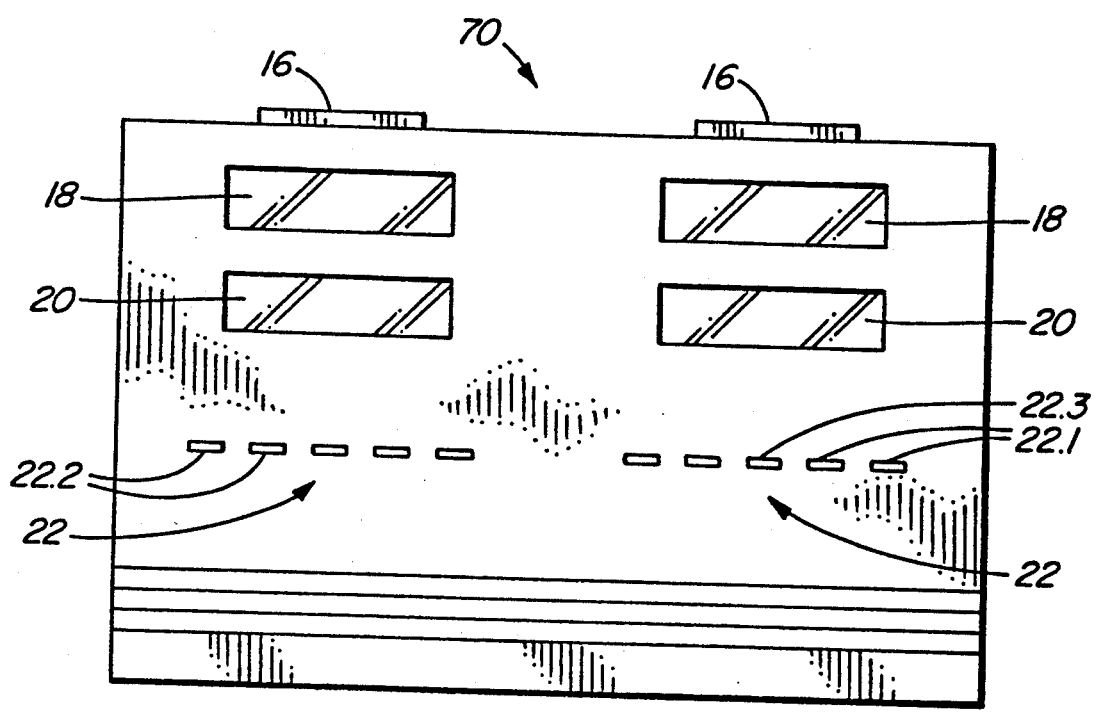
FIGS. 8A and 8B are front and side views of a power meter according to a further embodiment of the invention.
Figures 8B, 9:
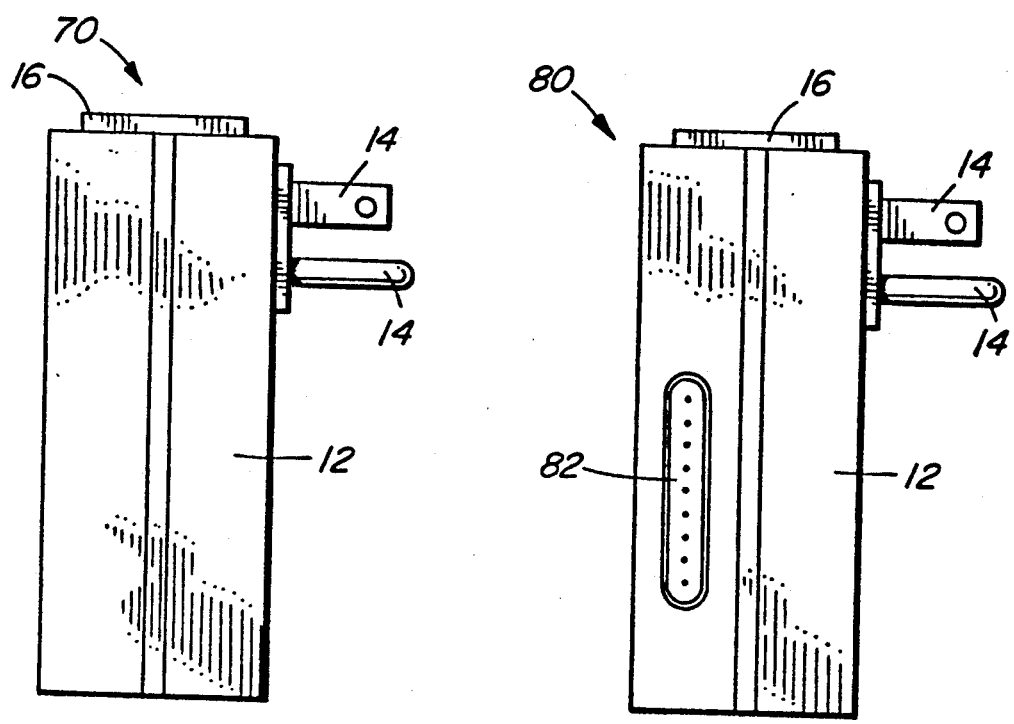
FIG. 9 is a side view of a power meter according to yet another embodiment of the invention.

With reference to FIGS. 8A and 8B, a power meter 70 according to yet a further embodiment of the invention is shown. The power meter 70 is provided with a set of prongs 14 on its rear side for insertion into an electric wall socket. It further has two electric sockets 16 on the top of the body member for receiving the electric plugs of two electrical appliances (not shown). Each of the sockets 16 is connected to the prongs 14 and current measuring means for measuring the current flow between each of the sockets 16 and the prongs 14, as well as timing means for measuring the duration of the electric current flow between each of the sockets 16 and the prongs 14 on the body member, are provided, in a similar fashion as described above with reference to FIG. 2.

FIG. 9 is a side view of a power meter 80 according to yet another embodiment of the invention. The power meter 80 is similar to the power meter of FIG. 1 except that it includes a computer interface 82 on the body member for downloading the measurement results of the power meter to an external computer for processing the results.

While only preferred embodiments of the invention have been described herein in detail, the invention is not limited thereby and modifications can be made within the scope of the attached claims.

What is claimed is:

1. An electric power consumption meter, comprising:
 a body member;
 prongs on the body member for insertion into an electric wall socket;
 a socket on the body member for receiving the plug of an electric appliance, said socket being in electrical communication with the prongs for transferring electric power from the prongs to said socket;
 a current meter in the body member for measuring electric current flow between said prongs and said socket on the body member;
 a timer for measuring the duration of said electric current flow;
 a data processor in the body member for receiving data from said current meter and said timer and for calculating a value for the quantity of electric power consumed from said data;
 a display on said body member for simultaneously displaying said value of the quantity of said electric power consumed and the time period during which such power has been so consumed; and
 colour coded lighting means on the body member for continuously indicating power consumption conditions throughout the range of power consumed by said appliance.

2. The consumption meter according to claim 1, wherein a plurality of said sockets are provided on the body member for receiving the plugs of a plurality of electrical appliances, each of said sockets being connected to said prongs on the body member and further comprising current measuring means for measuring electric current flow between each of said sockets and said prongs and timing means for measuring the duration of said electric current flow between each of said sockets and said prongs on the body member.

3. The consumption meter according to claim 2, further comprising computer interface means on the body member for downloading the measurement results of the consumption meter to an external computer for processing the results.

4. The consumption meter according to claim 1, further comprising data storage means in said body member for storing said measurement results.

5. The consumption meter according to claim 1, wherein said colour-coded lighting means comprises red light lighting means for indicating a relatively higher power consumption condition and green lighting means for indicating a relatively lower power consumption condition.

6. The consumption meter according to claim 5, wherein said red lighting means comprises two red LED's adjacent each other, said green lighting means comprises two green LED's adjacent each other and said colour-coded lighting means further includes intermediate lighting means comprising a white LED between said red and said green LED's for indicating an intermediate condition between said relatively higher and relatively lower consumption conditions.

* * * * *